United States Patent
Chen et al.

(10) Patent No.: US 10,505,705 B1
(45) Date of Patent: Dec. 10, 2019

(54) RECEIVER WITH CANCELLATION OF INTRINSIC OFFSET FROM DECISION FEEDBACK EQUALIZATION TO ENHANCE DATA MARGIN

(71) Applicant: QUALCOMM Incorporated, San Diego, CA (US)

(72) Inventors: Minhan Chen, Cary, NC (US); Li Sun, Irvine, CA (US); Chia Heng Chang, San Diego, CA (US); Hadi Goudarzi, San Diego, CA (US); Russell Deans, Chapel Hill, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/233,647

(22) Filed: Dec. 27, 2018

(51) Int. Cl.
| | |
|---|---|
| *H04L 7/00* | (2006.01) |
| *H04L 25/03* | (2006.01) |
| *H03L 7/08* | (2006.01) |
| *H04L 7/033* | (2006.01) |

(52) U.S. Cl.
CPC .......... *H04L 7/0025* (2013.01); *H03L 7/0807* (2013.01); *H04L 7/0331* (2013.01); *H04L 25/03019* (2013.01); *H04L 25/03267* (2013.01)

(58) Field of Classification Search
CPC ......... H04L 25/03057; H04L 25/03267; H04L 25/03019; H04L 7/0331; H04L 7/0025; H04L 7/033; H04L 7/0058; H03L 7/0807
See application file for complete search history.

(56) References Cited

U.S. PATENT DOCUMENTS

2010/0098147 A1* 4/2010 Miller ............... H04L 25/03057
375/233
2013/0148712 A1* 6/2013 Malipatil ............ H04L 25/0307
375/233

* cited by examiner

*Primary Examiner* — Sung S Ahn
(74) *Attorney, Agent, or Firm* — Haynes and Boone, LLP

(57) ABSTRACT

A receiver is provided that generates a data sampling clock that is offset by clock offset that is a function of a decision feedback equalizer gain to account for a data sampling timing error that would occur without the clock delay.

20 Claims, 5 Drawing Sheets

RECEIVER WITH CANCELLATION OF INTRINSIC OFFSET FROM DECISION FEEDBACK EQUALIZATION TO ENHANCE DATA MARGIN

TECHNICAL FIELD

This application relates to receivers with decision feedback equalizers, and more particularly to a receiver adapted to cancel the intrinsic offset that is not addressed by decision feedback equalization.

BACKGROUND

In embedded clock systems, the clock signal is embedded in the data signal so that it must be recovered from the data signal by a clock data recovery (CDR) circuit. To recover the clock signal, the CDR circuit uses, for example, a phase-locked loop so that an edge-locked clock signal is aligned with the data transition edges in the data signal. The edge-locked clock signal may also be denoted as a quadrature clock signal. Due to the edge alignment, the edge-locked clock signal is unsuitable for sampling the data signal. To properly sample the data signal, the CDR circuit also aligns an in-phase clock signal to be in quadrature (delayed by 90 degrees) with the edge-locked clock signal. In such systems, the receiver includes a phase detector that detects the phase between the clock signal and the data. A loop filter filters the phase detector output to produce a filtered phase difference so that the clock signal may be interpolated according to the filtered phase difference. The clock signal interpolation keeps the in-phase clock signal centered in the data eye so that the data may be sampled accordingly. The in-phase clock signal may also be denoted as the data sampling clock signal or the data clock signal.

For high-speed operation, the CDR circuit recovers the clock signal from equalized data as equalized by a decision feedback equalizer (DFE). Without such equalization, inter-symbol interference limits the achievable data rate. A simplified view of a conventional DFE 100 is shown in FIG. 1. A transmitted data signal (TX) drives a channel 101 over which a receiver including DFE 100 receives the data. The non-ideal properties of channel 101 cause the inter-symbol interference that is addressed by DFE 100. The data clock signal as recovered by the CDR circuit (not illustrated) clocks a slicer 110 to sample the incoming data. As known in the communication arts, slicer 110 (which may also be designated as a signal slicer or a bit slicer) includes a comparator that compares the incoming data to a threshold value to output the data samples. The sampled data from slicer 110 enters a delay chain represented by register 115 in DFE 100. The delay chain is also clocked by the data clock signal. The data samples of the received data signal in the delay chain are each given an associated weight as represented by a gain stage 120 before the sum of the weighted samples from the delay chain are subtracted from the received data signal at an adder 105. The combination of the delay chain and the gain thus forms a feedback finite impulse response (FIR) filter. Although this operation is conventional, note that adder 105 is implemented in the analog domain since the received data prior to the sampling by slicer 110 is not rail-to-rail. The different gains applied by gain stage 120 in response to changes in the properties of channel 101 then introduce a varying delay to the received data after passing through adder 105 due to its analog operation. After operation of slicer 110, this delay is unknown to the CDR circuit since the CDR circuit processes the post-adder received data signal. The edge-locked clock signal is thus skewed with regard to the actual data transitions. The received data should be sampled in quadrature to the data edges but the offset between the perceived data transitions and the actual data transitions causes the in-phase sampling to be too delayed in phase such that at higher data rates the sampling is not properly positioned within the data eye. This improper sampling leads to errors in recovering the data.

Accordingly, there is a need in the art for improved sampling of received data that has been equalized by a decision feedback equalizer.

SUMMARY

A receiver is provided that offsets an in-phase clock signal for sampling a received data signal by a phase offset responsive to a gain for a decision feedback equalizer. The gain loads an adder that processes a received data signal to produce a post-adder received data signal that is then sampled in a slicer responsive to the in-phase clock signal. The gain applied to the adder is used as a proxy for an un-cancelled inter-symbol interference (ISI) for the quadrature data samples as sampled by a quadrature clock signal for a clock data recover circuit. The decision feedback equalizer equalizes with respect to the in-phase data samples and thus does not cancel the ISI for the quadrature data samples. The clock data recovery circuit recovers the sampling clock signal (which is also denoted herein as a data sampling clock signal, an in-phase clock signal, or a data clock signal) from the received data signal and also aligns the quadrature clock signal to transitions in the received data signals as distorted or jittered by the un-cancelled ISI. The edge-locked (quadrature) clock signal is thus delayed in phase as compared to the actual transitions in the received data signal that would occur if the quadrature data samples had no ISI.

To account for this un-cancelled ISI in the quadrature data samples, the DFE gain is mapped into a corresponding clock offset applied to the in-phase clock signal to produce an adjusted in-phase clock signal that is advanced in phase by the clock offset. Note that this clock offset may instead be applied to the edge-locked or quadrature clock signal to advance it in phase by the clock offset. If the clock offset is applied to the edge-locked clock signal, the resulting adjusted in-phase clock signal is in quadrature with the edge-locked clock signal. But this quadrature relationship is broken if the clock offset is instead applied to the in-phase clock signal. The adjusted in-phase clock signal is thus properly centered within the data eye for a post-adder received data signal. This is quite advantageous with regard improving the accuracy of high-speed data communication.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To improve timing for a sampling of a received data signal that has been equalized by a decision feedback equalizer, the in-phase clock signal for sampling the received data in a slicer is advanced in phase by a clock offset that is responsive to the gain in the decision feedback equalizer. With regard to setting the gain, a controller in the decision feedback equalizer adjusts the gain responsive to the channel conditions. The circuits and techniques disclosed herein use the decision feedback equalizer gain as a proxy for the uncancelled inter-symbol interference that is affects the proper timing of an edge-locked clock signal. The adjusted in-phase clock signal is then used by the slicer to sample the received data. The slicer is then properly sampling the data at its "peaks" and "valleys" in the center of the data eye as opposed to sampling near the data transitions. In this fashion, high-speed operation with a decision feedback equalizer is considerably enhanced.

The following discussion will be directed to embedded clock implementations in which the CDR circuit recovers the in-phase clock signal from the received data signal. However, it will be appreciated that the clock offset disclosed herein may readily be applied to source synchronous systems in which the clock signal is not embedded with the transmitted data but instead is sent separately by the transmitter. In a CDR circuit for an embedded clock system, the clock recovery from the received data involves the generation of two separate clock signals. The CDR circuit generates an edge-locked or quadrature clock signal that is locked to the rising and falling edges of the received data signal. In addition, the CDR circuit generates an in-phase clock signal that is delayed in phase with respect to the edge-locked clock signal. It is the in-phase clock signal without any clock offset that in a conventional receiver would be used to sample the data in the receiver's slicer. The clock offset discussed herein may be performed either on the edge-locked clock signal or the in-phase clock signal. Should the edge-locked clock signal be advanced in phase by the clock offset to form an offset edge-locked clock signal, the adjusted in-phase clock signal would be phased to be in quadrature with the delayed edge-locked clock signal. Alternatively, the in-phase clock signal itself may be advanced in phase by the clock offset relative to being in quadrature with the edge-locked clock signal. Regardless of which clock signal is offset by the phase offset, the resulting adjusted in-phase clock signal is advantageously positioned in the center of the data eye for the received data signal as opposed to being displaced toward an edge of the data eye due to the un-cancelled inter-symbol interference for the quadrature sampling of the received data signal by the edge-locked clock signal.

Figure 1:
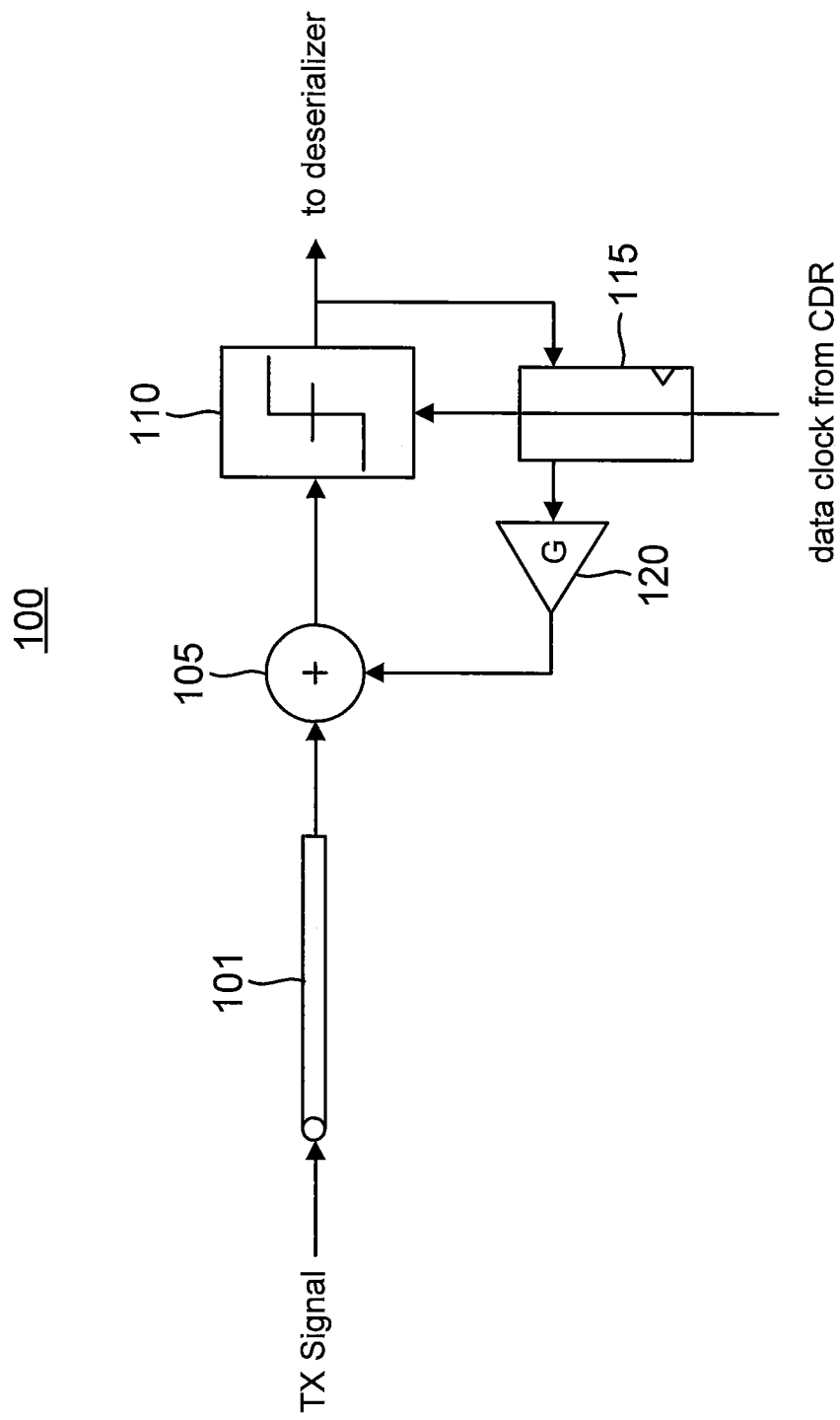
FIG. 1 illustrates a conventional receiver for sampling received data that has been equalized by a decision feedback equalization.
Figure 2A:
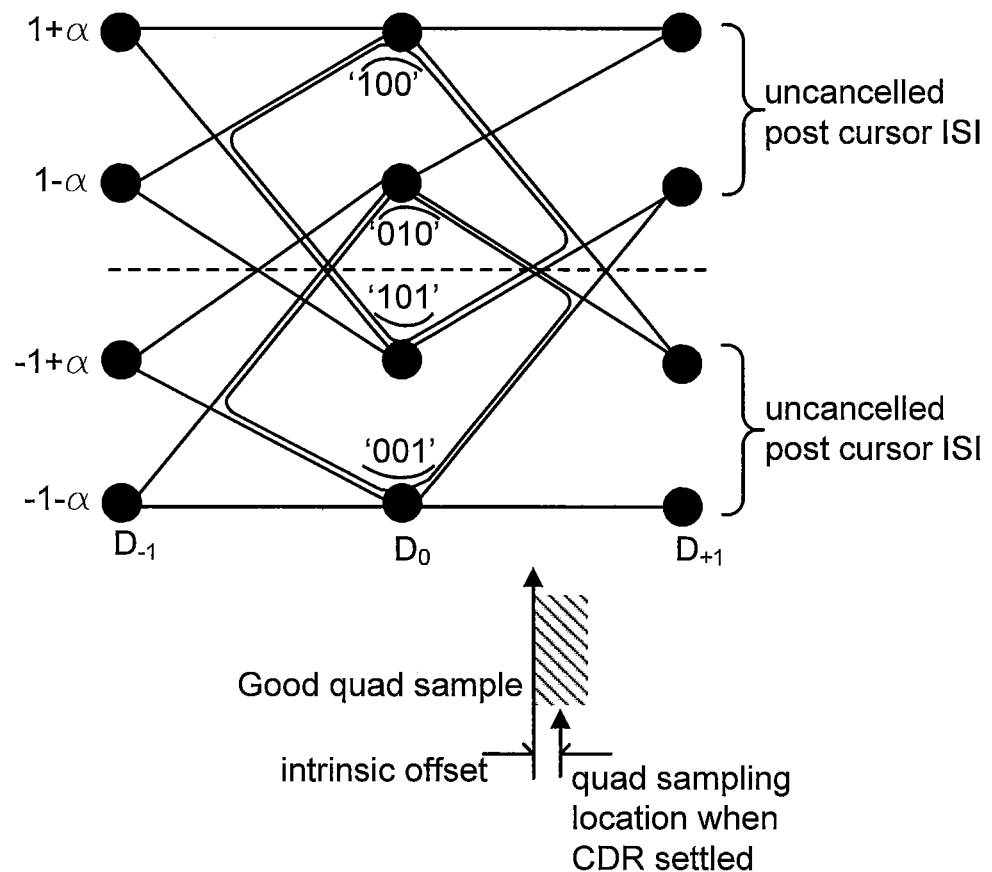
FIG. 2A is a graph showing the effect of inter-symbol interference across three consecutive bits for the received data signal.

A decision feedback equalizer includes an adder such as adder 105 discussed earlier that produces a post-adder received data signal. It is the post-adder received data signal that is sampled by the slicer to form in-phase and quadrature data samples. The effect of the un-cancelled inter-symbol interference for the DFE first tap (discussed further below) on the quadrature sampling of the slicer output signal is illustrated in FIG. 2A. In this example, it is assumed that the ISI for the remaining DFE taps is cancelled. It is the uncancelled ISI for the first tap that is significant for the quadrature sampling. The adder forces its output signal to be "full rail" with regard to a positive value designated as 1 and a negative value designated as −1. Without the un-cancelled inter-symbol interference, the slicer data samples would thus equal either 1 or −1 depending upon the binary value being transmitted. In FIG. 2A, the slicer samples range over three bits beginning with a preceding bit a current bit $D_0$, and a subsequent bit $D_{+1}$. A factor $\alpha$ represents the effect of the un-cancelled inter-symbol interference (ISI). For example, suppose that the bit (not illustrated) prior to preceding bit $D_{-1}$ was a 1 and that all three bits $D_{-1}$, $D_0$, $D_{+1}$ are also binary ones. The uncancelled ISI then causes each bit to equal the sum of 1+$\alpha$. Conversely, if all four bits equal −1, the un-cancelled ISI causes the three bits $D_{-1}$, $D_0$, $D_{+1}$ to all equal −1−$\alpha$. If the preceding bit $D_{-1}$ was −1 and the current bit $D_0$ is 1, the un-cancelled ISI causes the current bit to equal 1−$\alpha$. Finally, if the preceding bit $D_{-1}$ was 1 and the current bit $D_0$ is −1, the un-cancelled ISI causes the current bit to equal −1+$\alpha$. The resulting potential values for the bits causes a jitter to the data transition depending upon the binary succession. For example, the transition between the current bit $D_0$ and the subsequent bit DA in the binary succession of 001 or 100 occurs later than the transition between the same bits in the binary succession of 010 or 101. The cross-hatched area in FIG. 2A represents this spread between the data transitions. Since the CDR circuit will average over all the potential data transitions in locating the edge-locked clock signal, the quad sampling location will average to the middle of the cross-hatched area (in between the edge extremes between the earlier transition of 010 or 101 and the later transition for 001 or 100.

Figure 2B:
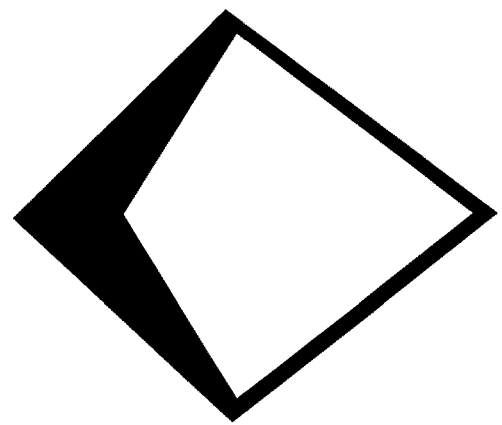
FIG. 2B illustrates the edge-locked clock and the in-phase clock for a data eye without any clock offset.
Figure 2B:
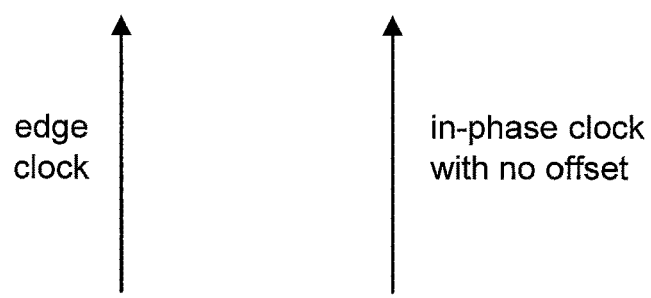
Figure 2C:
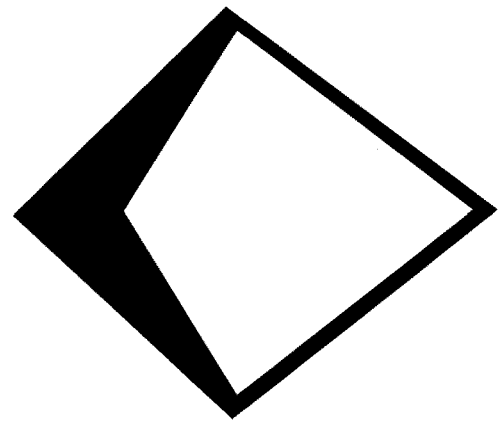
FIG. 2C illustrates the edge-locked clock and an adjusted in-phase clock for a data eye accordance with an aspect of the disclosure.
Figure 2C:
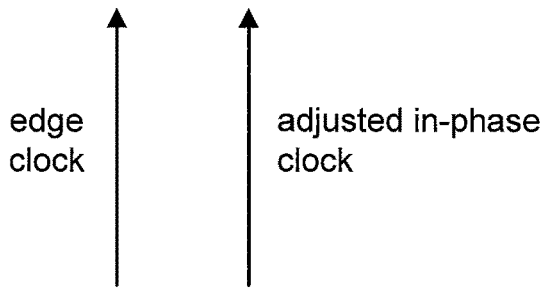

An example data eye for the in-phase data samples is shown in FIG. 2B that also illustrates the quadrature sampling point taken by the edge-locked clock signal in which the un-cancelled ISI causes the darkened jittered area at the edge of the data eye. Since the CDR circuit has determined a quadrature clock signal that is delayed from the true edge of the data, eye, the in-phase clock sampling point is delayed or offset from the center of the data eye since a conventional CDR circuit maintains the two clock signals to be in quadrature. The in-phase data samples are thus subjected to jitter due to the poor timing with regard to the true center of the data eye. A clock offset (designated as an intrinsic offset in FIG. 2B) may thus be added to the quadrature clock signal to advance it in phase to form an adjusted edge-locked clock signal that produces a good quadrature sample (in the center of the period in between the in-phase data samples). Alternatively, as shown in FIG. 2C, the clock offset may instead be applied to the adjusted in-phase clock signal so that it is advantageously centered in the data eye even though the quadrature sampling point remains as shown for FIG. 2A. The quadrature relationship between the adjusted in-phase clock signal and the quadrature or edge-locked clock signal is thus broken by the clock offset in FIG. 2C. Alternatively, the edge-locked clock signal may be offset such that the adjusted in-phase clock signal is in a conventional quadrature position with regard to the offset edge-locked clock signal as occurs in FIG. 2B. Some example implementations for a receiver employing such an advantageous clock offset will now be discussed.

Figure 3:
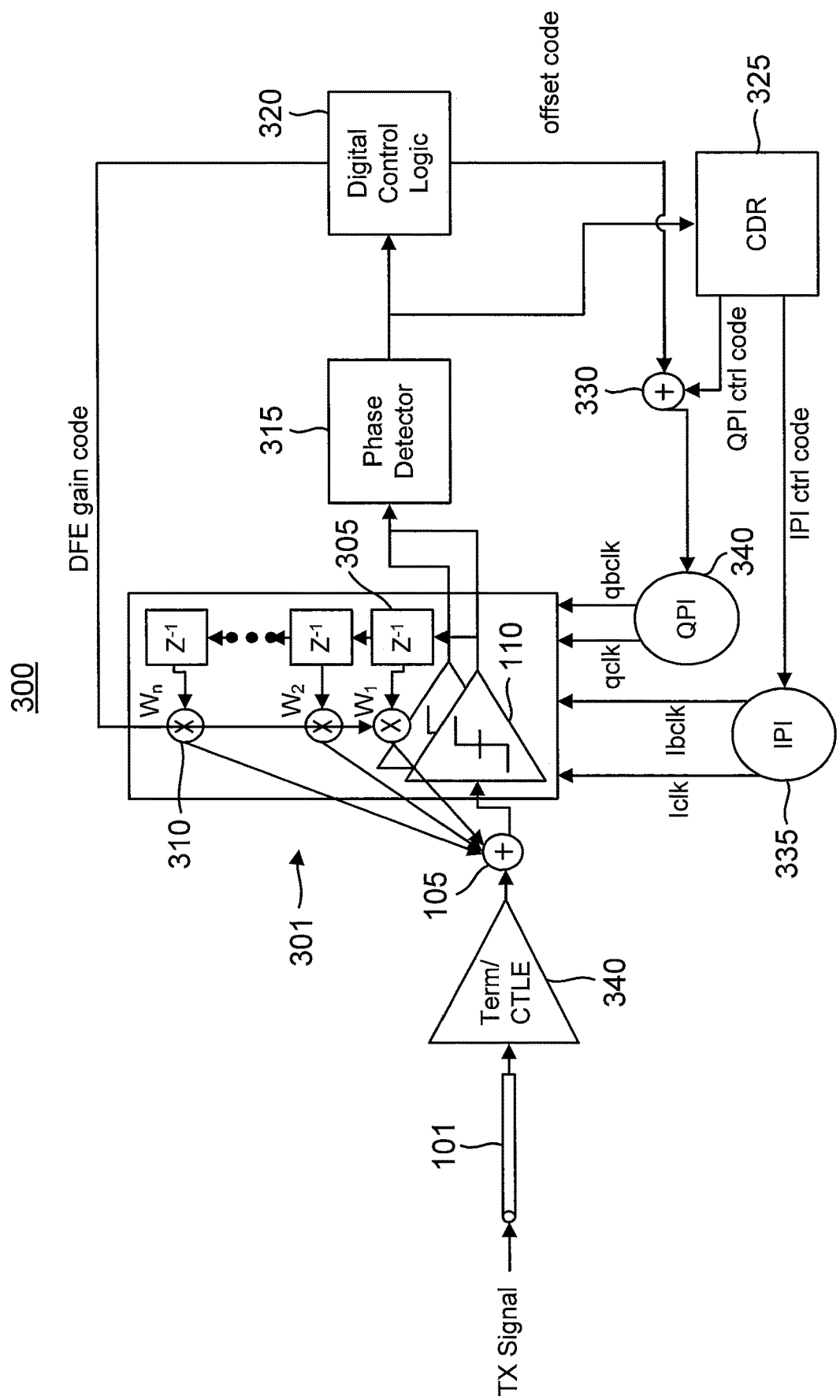
FIG. 3 illustrates a receiver configured to sample received data that has been equalized by a decision feedback equalizer using an offset sampling clock signal in accordance with an aspect of the disclosure.

An example implementation of a receiver 300 with a decision feedback equalizer 301 is shown in FIG. 3 in which a digital control logic circuit 320 maps the decision feedback equalizer gain into a clock or phase offset applied to the in-phase clock signal to account for the un-cancelled ISI that would otherwise affect the in-phase data sampling point. A transmitted signal drives a channel 101 to force a received data signal into a continuous time linear equalizer (CTLE) 340, which may be a passive or an active equalizer. Although the use of CTLE 340 is advantageous, it may be omitted in alternative implementations depending upon the properties of channel 101.

As discussed for conventional receiver 100, adder 105 introduces a delay into the post-adder received data signal. A pair of in-phase (I) and quadrature (Q) slicers 110 sample the post-adder received data signal to form a sampled data signal. The in-phase (I) samples represent the data since the Q channel is merely used by a CDR circuit 325 to locate the data transitions. It is thus the in-phase sampled data signal from the I slicer 110 that is filtered by a feedback FIR filter for decision feedback equalizer 301 as formed by a delay chain of delay stages 305 that successively delay the in-phase data samples. The resulting delayed in-phase data sample are multiplied by corresponding weights as applied in multipliers 310. As known in the decision feedback equalization arts, a phase detector 315 detects the phase between the I and Q sampled data streams so that a CDR circuit 325 may adjust its clock signals accordingly. In addition, control logic circuit 320 in DFE 301 determines the weights applied by multipliers 310 responsive to the phase detector output signal. In particular, control logic circuit 320 determines a weight W1 for a first delay stage 305, a weight W2 for a second delay stage 305, and so on such that digital control logic circuit 320 also determines a final Nth weight Wn applied by a final Nth delay stage 305. The gain applied by DFE 301 is thus represented by the N weights W1 through Wn determined by digital control logic circuit 320. The resulting weighted sum of the delayed in-phase data samples are subtracted from the received data signal at adder 105.

Digital control logic 320 also determines a clock offset responsive to the gain as represented by the first tap coefficient W1 applied to the first sample from first delay stage 305. It is this first tap coefficient that represents the un-cancelled ISI discussed with regard to FIG. 2A. The mapping between the DFE first tap gain and the clock offset commanded for by digital control logic circuit 320 may be determined by a simulation. Alternatively, the mapping may be determined empirically at the manufacture of an integrated circuit including receiver 300 such that fuses or some other suitable form of memory (not illustrated) associated with control logic circuit 320 may store the desired mapping. In one implementation, control logic circuit 320 may be deemed to form a means for mapping the decision feedback equalizer gain into a clock offset that substantially equals the un-cancelled ISI for the quadrature data samples.

Depending upon the perceived data transitions, CDR circuit 325 generates an in-phase interpolation control code (IPI ctrl code) for controlling an in-phase interpolated clock source (IPI) 335. Clock source 335 generates an adjusted in-phase clock signal (Iclk) and its complement (Ibclk) responsive to the in-phase interpolation code. In addition, CDR circuit 325 generates a quadrature-phase interpolation (QPI) code to control a quadrature-phase interpolated clock source QPI 340 to generate a quadrature clock signal (qclk) and its complement (qbclk). Digital control logic circuit 320 generates an offset code responsive to the mapping of the DFE gain. An adder 330 adds the offset code to the QPI code so that the quadrature clock signal and its complement (qbclk) are advanced in phase appropriately so as to be at the edge of the data eye as shown in FIG. 2A for the good quadrature sample. As discussed earlier, the clock offset may instead be applied to the in-phase clock signal. Regardless of whether the in-phase clock signal or the quadrature clock signal is offset, the resulting in-phase clock signal may be denoted as an adjusted in-phase clock signal since it has been displaced in phase as compared to a conventional in-phase clock signal with no offset such as shown in FIG. 2B.

Figure 4:
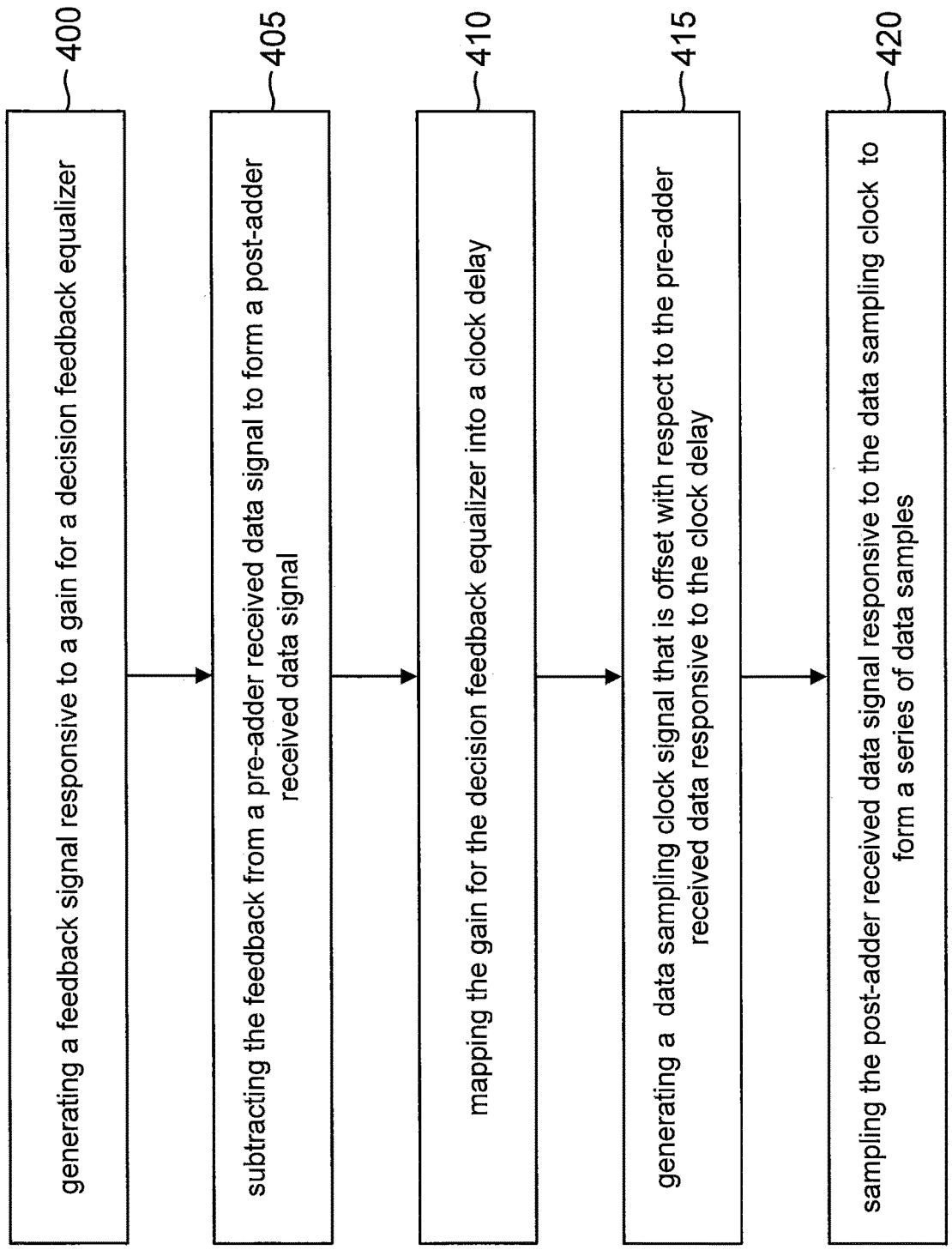
FIG. 4 is a flowchart for an example method of properly sampling a received data signal that has been equalized by a decision feedback equalizer in accordance with an aspect of the disclosure.

A method of sampling a received data signal that has been equalized by a decision feedback equalizer will now be discussed with regard to the flowchart of FIG. 4. The method begins with an act 400 of generating a feedback signal responsive to a gain for a decision feedback equalizer. The summation of the weighted delayed in-phase (I) data samples as discussed for the feedback FIR filter of receiver 300 is an example of act 400. In addition, the method includes an act 405 of subtracting the feedback signal from a pre-adder received data signal to form a post-adder received data signal. The operation of adder 105 is an example of act 405. The method further includes an act 410 of mapping the gain for the decision feedback equalizer into a clock offset. The formation of the offset code as discussed regarding digital control logic circuit 320 is an example of act 410. The method further includes an act 415 of generating a data sampling (in-phase) clock signal that is advanced in phase by the clock offset with respect to the pre-adder received data signal. The formation of in-phase clock signal iclk is an example of act 415. Finally, the method also includes an act 420 of sampling the post-adder received data signal responsive to the data sampling clock signal to form a series of data samples. The operation of slicer 110 is an example of act 420.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A receiver, comprising:
   a finite impulse response filter configured to generate a feedback signal responsive to a gain for a decision feedback equalizer;
   an adder configured to subtract the feedback signal from a pre-adder received data signal to form a post-adder received data signal; and
   a clock data recovery circuit configured to generate a data sampling clock signal that is advanced in phase with respect to data transitions in the post-adder received data signal by a clock offset responsive to the gain for the decision feedback equalizer.

2. The receiver of claim 1, further comprising:
a slicer configured to sample the post-adder received data signal responsive to the data sampling clock signal to form a series of data samples.

3. The receiver of claim 2, wherein the slicer comprises an in-phase slicer, the receiver further comprising a quadrature-phase slicer configured to sample the post-adder received data signal to form a series of quadrature data samples.

4. The receiver of claim 3, further comprising a phase detector configured to determine a phase between the series of data samples and the series of quadrature data samples.

5. The receiver of claim 1, further comprising:
a linear equalizer configured to equalize a received data signal to form the pre-adder received data signal.

6. The receiver of claim 1, further comprising a logic circuit configured to map the gain for the decision feedback equalizer into the clock offset.

7. The receiver of claim 2, wherein the slicer is further configured to sample the post-adder received data signal responsive to a complement of the data sampling clock signal.

8. The receiver of claim 1, wherein the clock data recovery circuit is further configured to generate an edge-locked clock signal that is locked to data transitions in the post-adder received data signal, and wherein the clock data recovery circuit is further configured to generate the data sampling clock signal to be advanced in phase by the clock offset with respect to a quadrature of the edge-locked clock signal.

9. The receiver of claim 1, wherein the clock data recovery circuit is further configured to generate an offset edge-locked clock signal that is offset with respect to data transitions in the post-adder received data signal by the clock offset, and wherein the clock data recovery circuit is further configured to generate the data sampling clock signal to be in quadrature with the offset edge-locked clock signal.

10. A method for a receiver, comprising:
generating a feedback signal responsive to a gain for a decision feedback equalizer;
subtracting the feedback signal from a pre-adder received data signal to form a post-adder received data signal;
mapping the gain for the decision feedback equalizer into a clock offset;
generating a data sampling clock signal that is advance in phase with respect to the post-adder received data signal by the clock offset; and
sampling the post-adder received data signal responsive to the data sampling clock signal to form a series of data samples.

11. The method of claim 10, further comprising:
generating the mapping by an empirical test of an integrated circuit including the receiver.

12. The method of claim 10, further comprising:
generating the mapping using a simulation of the receiver.

13. The method of claim 10, further comprising:
generating an edge-locked clock signal that is locked to data transitions in the post-adder received data signal, wherein the data sampling clock signal is offset by the clock offset with respect to a quadrature with the edge-locked clock signal.

14. The method of claim 10, further comprising:
linearly equalizing a received data signal to form the pre-adder received data signal.

15. The method of claim 10, wherein the subtracting of the feedback signal from the pre-adder received data signal to form the post-adder received data signal delays the post-adder received data signal by an adder delay that varies according to the gain for the decision feedback equalizer.

16. The method of claim 15, wherein the clock offset substantially equals the adder delay.

17. A receiver, comprising:
a decision feedback equalizer including a digital control logic circuit configured to generate a decision feedback equalizer gain for a feedback signal;
an adder configured to subtract the feedback signal from a pre-adder received data signal to form a post-adder received data signal;
an in-phase slicer configured to sample the post-adder received data signal responsive to an adjusted in-phase clock signal to generate in-phase data samples;
a quadrature-phase slicer configured to sample the post-adder received data signal responsive to a quadrature clock signal to generate quadrature data samples;
means for mapping the decision feedback equalizer gain into a clock offset that substantially equals an un-cancelled inter-symbol interference for the quadrature data samples; and
a clock data recovery circuit configured to generate the adjusted in-phase clock signal that is advanced in phase with respect to data transitions in the post-adder received data signal by the clock offset.

18. The receiver of claim 17, wherein the clock data recovery circuit is further configured to generate the quadrature clock signal to be advanced in phase with respect to the data transitions in the post-adder received data signal by the clock offset, and wherein the adjusted in-phase clock signal is in quadrature with the quadrature clock signal.

19. The receiver of claim 18, wherein the clock data recovery circuit is further configured to generate the adjusted in-phase clock signal to be advanced in phase by the clock offset with respect to being in quadrature to the quadrature clock signal.

20. The receiver of claim 17, further comprising a phase detector configured to determine a phase between the in-phase data samples and the quadrature data samples.

* * * * *